(12) United States Patent
Angle et al.

(10) Patent No.: US 9,478,695 B2
(45) Date of Patent: Oct. 25, 2016

(54) INTERFACE BETWEEN A I/III/VI2 LAYER AND A BACK CONTACT LAYER IN A PHOTOVOLTAIC CELL

(71) Applicant: NEXCIS, Rousset (FR)

(72) Inventors: Stephanie Angle, Rousset (FR); Ludovic Parissi, Rousset (FR)

(73) Assignee: NEXCIS, Rousset (FR)

( * ) Notice: Subject to any disclaimer, the term of this patent is extended or adjusted under 35 U.S.C. 154(b) by 0 days.

(21) Appl. No.: 14/358,185

(22) PCT Filed: Nov. 22, 2012

(86) PCT No.: PCT/FR2012/052703
§ 371 (c)(1),
(2) Date: May 14, 2014

(87) PCT Pub. No.: WO2013/083897
PCT Pub. Date: Jun. 13, 2013

(65) Prior Publication Data
US 2014/0315346 A1    Oct. 23, 2014

(30) Foreign Application Priority Data
Dec. 5, 2011 (FR) .................................. 11 61172

(51) Int. Cl.
*H01L 31/18* (2006.01)
*H01L 31/0224* (2006.01)
(Continued)

(52) U.S. Cl.
CPC ..... *H01L 31/1864* (2013.01); *H01L 21/02491* (2013.01); *H01L 21/02568* (2013.01);
(Continued)

(58) Field of Classification Search
CPC .............. H01I 21/02491; H01L 31/0322; H01L 21/02491; H01L 21/02568; H01L 31/1864; H01L 21/02658; H01L 21/02614

USPC ................... 438/95, 488; 257/E31, 184, 431
See application file for complete search history.

(56) References Cited

U.S. PATENT DOCUMENTS 7,547,569 B2    6/2009  Weidman et al.
8,008,113 B2 *  8/2011  Basol .............................. 438/95
(Continued)

FOREIGN PATENT DOCUMENTS

CN      101752454      6/2010
JP      H 04-056172    2/1992
(Continued)

OTHER PUBLICATIONS

International Search Report and Written Opinion dated Mar. 6, 2013 for Application No. PCT/FR2012/052703.
(Continued)

*Primary Examiner* — Victor A Mandala
*Assistant Examiner* — Regan J Rundio
(74) *Attorney, Agent, or Firm* — Frost Brown Todd LLC

(57) ABSTRACT

The invention relates to a method of manufacturing a I-III-VI$_2$ layer with photovoltaic properties, comprising:
  deposition of a metal on a substrate to form a contact layer,
  deposition of a precursor of the photovoltaic layer, on the contact layer, and
  heat treatment of the precursor with an addition of element VI to form the I-III-VI$_2$ layer.
The element VI usually diffuses into the contact layer (MO) during the heat treatment and combines with the metal to form a superficial layer (SUP) on the contact layer.
In the method of the invention, the metal deposition comprises a step during which an additional element is added to the metal to form a compound (MO-EA), in the contact layer, acting as a barrier to the diffusion of the element VI, which allows precisely controlling the properties of the superficial layer, particularly its thickness.

9 Claims, 4 Drawing Sheets

Figure 1:
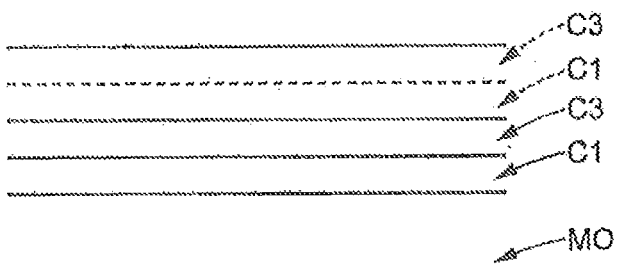
Figure 1:
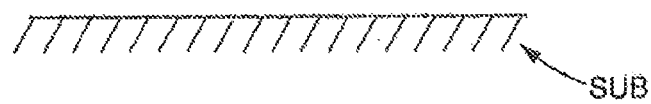

(51) Int. Cl.
*H01L 31/04* (2014.01)
*H01L 31/0749* (2012.01)
*H01L 31/0296* (2006.01)
*H01L 21/02* (2006.01)
*H01L 31/032* (2006.01)
*H01L 31/0392* (2006.01)

(52) U.S. Cl.
CPC ... *H01L21/02614* (2013.01); *H01L 21/02658* (2013.01); *H01L 31/0296* (2013.01); *H01L 31/022425* (2013.01); *H01L 31/0322* (2013.01); *H01L 31/0392* (2013.01); *H01L 31/0749* (2013.01); *H01L 31/03928* (2013.01); *Y02E 10/541* (2013.01); *Y02P 70/521* (2015.11)

(56) References Cited

U.S. PATENT DOCUMENTS

| | | | | |
|---|---|---|---|---|
| 8,134,069 | B2* | 3/2012 | Mackie et al. | 136/264 |
| 8,198,117 | B2* | 6/2012 | Leidholm et al. | 438/57 |
| 8,389,852 | B2* | 3/2013 | Krasnov | H01L 31/022425 136/252 |
| 8,822,809 | B2* | 9/2014 | Kwon | H01L 31/022425 136/244 |
| 2005/0266682 | A1* | 12/2005 | Chen | C23C 14/022 438/637 |
| 2010/0068882 | A1* | 3/2010 | Yun | H01L 21/2855 438/674 |
| 2010/0229940 | A1* | 9/2010 | Basol | H01L 21/02568 136/256 |
| 2010/0258191 | A1* | 10/2010 | Mackie | 136/264 |
| 2010/0297835 | A1* | 11/2010 | Chuang et al. | 438/488 |
| 2010/0317144 | A1* | 12/2010 | Basol | 438/95 |
| 2011/0294254 | A1* | 12/2011 | Jackrel et al. | 438/95 |
| 2012/0174977 | A1* | 7/2012 | Choi | H01L 31/022425 136/256 |
| 2012/0313200 | A1* | 12/2012 | Jackrel et al. | 257/431 |
| 2014/0338741 | A1* | 11/2014 | Palm | H01L 31/03923 136/256 |

FOREIGN PATENT DOCUMENTS

| | | | |
|---|---|---|---|
| JP | 2006147759 | 6/2006 | |
| KR | 20090034079 | 4/2009 | |
| WO | WO 2011040782 A2 * | 4/2011 | ..... H01L 31/022425 |
| WO | WO 2011046388 A2 * | 4/2011 | ..... H01L 31/022425 |

OTHER PUBLICATIONS

French Preliminary Search Report and Written Opinion dated Jul. 25, 2012 for Application. No. FR 1161172.

Blosch, P., et al., "Comparative Study of Different Back-Contact Designs for High-Efficiency CIGS Solar Cells on Stainless Steel Foils," IEEE Journal of Photovoltaics, vol. 1, No. 2, Dec. 2011, pp. 194-199.

Song, S., et al., "Diffusion barrier performances of thin Mo, Mo-N and Mo/Mo-N films between Cu and Si," This Solid Films, 476 (2005), pp. 142-147.

* cited by examiner

INTERFACE BETWEEN A I/III/VI2 LAYER AND A BACK CONTACT LAYER IN A PHOTOVOLTAIC CELL

The invention relates to the fabrication of a I-III-VI$_2$ layer with photovoltaic properties, particularly but not limited to applications in solar cells.

A material having a stoichiometry similar or equal to I-III-VI$_2$, in the form of a light-absorbing thin film, is suitable for applications in such cells. Element I can be copper Cu for example (column I in the periodic classification). Element III can be indium In, gallium Ga, or aluminum Al (column III in the periodic classification). Element VI can be sulfur S or selenium Se (column VI in the periodic classification), for example. The I-III-VI$_2$ alloy is commonly referred to as CIGS (C for copper, I for indium, G for gallium, and S for sulfur and/or selenium).

In an advantageous method which is economical and easy to implement industrially, elements I and III are deposited as precursors, for example by electrolysis or sputtering, onto a thin metal electrical contact layer which is often of molybdenum Mo (referred to below by the general term "metal"). This contact layer is deposited beforehand, for example by sputtering, onto a metal substrate or a glass substrate (referred to below by the more general term "substrate").

Then the element VI is added by a high temperature reaction with the I-III precursors, for example in an oven containing an atmosphere of sulfur and/or selenium. This step is referred to as "sulfuration" or "selenization." The crystalline alloy obtained is of the composition I-III-VI$_2$ and has a chalcopyrite structure; the formation of this compound is referred to below as "chalcogenization." Such an alloy advantageously possesses photovoltaic properties and its integration as a thin film makes it a material of choice for the fabrication of photovoltaic cells.

During the selenization and/or sulfuration step for forming the photovoltaic alloy, the spontaneous formation of a natural layer of a compound resulting from a combining of the metal in the contact layer and of the element VI added during this step has been observed. For example, in the case where the metal of the contact layer is molybdenum and the element VI is selenium, the natural formation of a layer of MoSe$_2$ can be observed during selenization, at the interface between the molybdenum of the contact layer and the CIGS above, with the selenium reacting with the Mo metal of the contact layer.

The element VI can thus diffuse into the contact layer during the heat treatment, by combining with the metal to form a superficial layer on the contact layer.

This superficial layer (MoSe$_2$ as a non-limiting example) is beneficial for numerous reasons.

For example, this superficial layer advantageously facilitates a quasi-ohmic electrical contact between the I-III-VI$_2$ layer and the metal of the contact layer. The adhesion properties and electrical properties of the interface between the I-III-VI$_2$ layer and the contact layer are determined by controlling the thickness and morphology of the superficial layer, particularly its crystalline orientation.

It also plays a role in the optimization of a laser etching process, particularly of the I-III-VI$_2$ layer.

The properties of this superficial layer need to be managed, particularly the morphology and/or thickness, to ensure uniformity of these properties in the plane of the layer (uniformity in the plane (X,Y), as the Z axis is the growth axis of the layers).

The invention improves the situation.

It proposes a method for fabricating a I-III-VI$_2$ layer having photovoltaic properties, comprising:
 deposition of a metal on a substrate to form a contact layer,
 deposition of a precursor of the photovoltaic layer, on the contact layer, and
 heat treatment of the precursor with an addition of element VI to form the I-III-VI$_2$ layer.

As indicated above, the element VI diffuses into the contact layer during the heat treatment and combines with the metal to form a superficial layer of the above type, on the contact layer.

In the method of the invention, the metal deposition comprises a step during which an additional element is added to the metal to form a compound, in the contact layer, acting as a barrier to the diffusion of the element VI, particularly in order to control the properties of the superficial layer concerning the thickness and/or morphology.

An advantage of the invention consists of the barrier to the diffusion of the element VI actually being formed in a simple manner during the general metal deposition operation. For example, when the metal deposition occurs in a vacuum chamber, the additional element is integrated into the metal layer during one of the metal deposition steps, with no exposure to the atmosphere nor change of chamber. It is sufficient to simply introduce the additional element into the same chamber during the barrier layer deposition step, as will be seen in a few examples given below.

For example, the metal deposition can occur under vacuum using the technique of sputtering a target with a cold plasma of a carrier gas (generally argon). This technique is commonly referred to as sputtering or PVD (for Physical Vapor Deposition). In an embodiment where the additional element is, for example, nitrogen (or as a variant, oxygen), it is possible to add the additional element to the gas carrying the plasma. This is known as reactive sputtering of the metal target.

During the above step of depositing the barrier layer, a mixture in the plasma gas contains:
 argon and
 for example nitrogen
(for example in a proportion of 10 to 50% and more particularly within a range of 15 to 25% nitrogen).

Note that as a variant, it is also possible to provide the additional element directly in the target and it is therefore deposited onto the substrate with the metal, typically in the proportion of metal/additional element that is defined by the composition of the target.

In more generic terms, the metal is deposited by sputtering a sputter target containing said metal, the sputtering then being carried out using a plasma containing said additional element in order to form the barrier layer and, in a variant, sputtering, during said step of forming the barrier layer, a sputter target containing molybdenum and the additional element (for example another metal such as titanium, which when alloyed with molybdenum also forms a barrier to selenium).

In one possible embodiment, this step of depositing the barrier layer can be followed by a deposition of metal without the additional element, to control the properties of the superficial layer.

In a variant, this step of depositing the barrier layer ends the general deposition of the contact layer. Such a variant allows limiting the superficial layer to a very low thickness (only a few nanometers in the particular example of MoSe$_2$).

Preferably, said step of depositing the barrier layer is preceded by a deposition of the metal, without said additional element, in particular to ensure that the contact layer has good conduction properties.

For example, the metal can be deposited onto the substrate by sputtering while the substrate makes several passes in front of the same metal target or one pass in front of several metal targets without leaving the vacuum. For example, the next-to-last or last pass in front of the metal target can occur using reactive sputtering to form the barrier layer.

In an example embodiment, the metal of the contact layer can be molybdenum (deposited on a glass or metal substrate). Other variants are possible, however. For example, with a metal substrate, an adaptation layer of nickel can be chosen and the metal of said contact layer is then nickel. In other variants, titanium, chrome, gold, and/or ruthenium can be used (to form nitrides and/or oxides of these metals, as barrier materials).

The additional element can be at least one of the following elements:
  nitrogen, to form a nitride as barrier material against diffusion of the element VI,
  oxygen, to form an oxide as barrier material against diffusion of the element VI, and
  a metal (for example titanium or chromium, or other) to form an alloy as barrier material against diffusion of the element VI.

As indicated above, the element VI can be selenium (or sulfur or a mixture of the two types).

The metal can be deposited, for example, by sputtering a target in a vacuum. In the example case where the additional element is nitrogen (or oxygen), as indicated above, the plasma gas (usually argon) can contain a proportion of nitrogen (or oxygen) within a range for example of 10 to 50% (for example about 20% within the range of 15 to 25%).

For example, if usually a substrate is made to pass several times in succession in front of a sputter target of metal, these different passes occur in argon plasma only, except for example during the next-to-last pass which occurs in front of a target of said metal sputtered with a plasma containing a mixture of argon and nitrogen for example.

Next comes a "stack" comprising:
  a relatively thick metal layer, for example of molybdenum, ensuring good rear contact for a future photovoltaic cell,
  a thin layer of molybdenum nitride, forming a barrier to the diffusion of the element VI, above the thick layer, and
  another thin layer, of pure molybdenum, which has the purpose of reacting with the element VI to form said superficial layer (for example of $MoSe_2$ if the element VI is selenium). This thin layer is then called a "sacrificial" layer.

The precursor, typically based on elements I and III, can be deposited by electrolysis. For example, one technique consists of depositing a copper layer, then one or more layers of element III (indium and/or gallium), and heat treating this stack in an atmosphere of element VI.

However, a possible variant consists of depositing the precursor by sputtering, advantageously in the same deposition chamber that is used to obtain the contact layer (again without requiring exposure to air and subsequent placement in a second vacuum chamber). It should be stated, of course, that an absolute vacuum cannot be obtained in a sputtering chamber. The phrase "sputtering in a vacuum" is understood to mean placement in a vacuum sufficient to avoid contamination of the metal layer during formation (for example pressure within the chamber of less than $10^{-5}$ bar).

Thus the barrier layer constitutes a characteristic feature of the implementation of the method of the invention in a photovoltaic cell, and in particular, the invention also relates to such a photovoltaic cell comprising:
  an alloy layer of elements I, III and VI, this layer having photovoltaic properties, and
  a contact layer, comprising a metal, under the photovoltaic layer.

An intermediate layer, located between the photovoltaic layer and the contact layer, comprises a compound of metal-element VI (for example $MoSe_2$).

The cell of the invention additionally comprises, under the layer of metal-element VI compound, a layer comprising an additional element forming, with said metal, a compound forming a barrier to the diffusion of element VI.

Figure 5A:
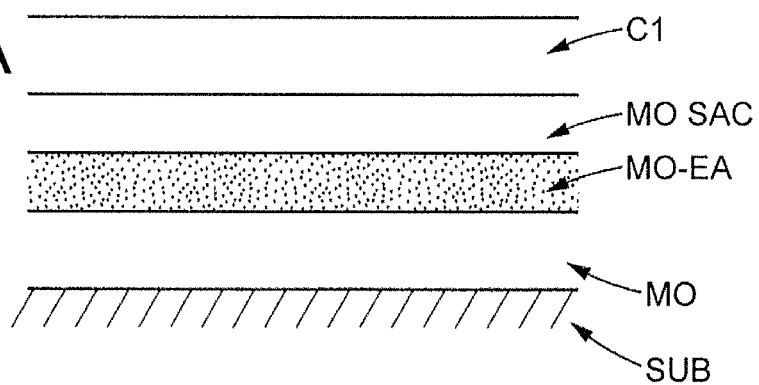
Figure 5B:
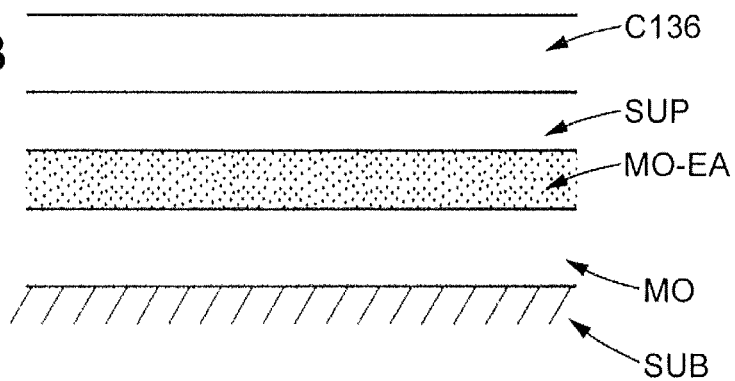

A partial representation of the cell of the invention can be as shown in FIG. 5B, which will be described below as an example embodiment.

Figure 2:
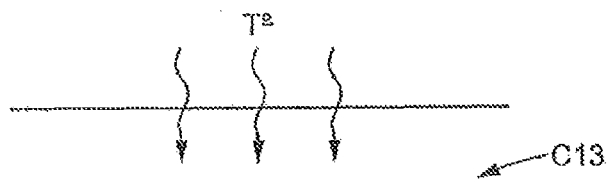
Figure 3:
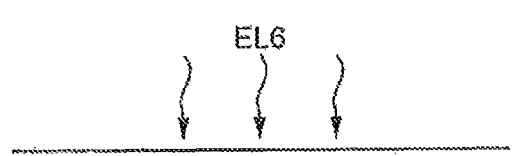
Figure 3:
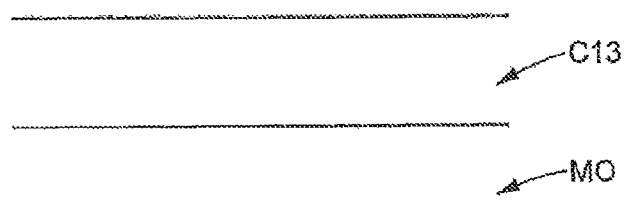
Figure 3:
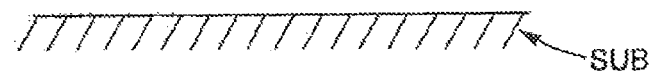
Figure 4:
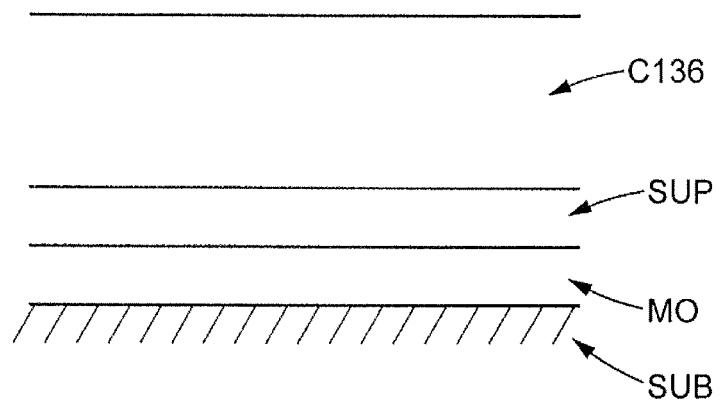
Figure 6:
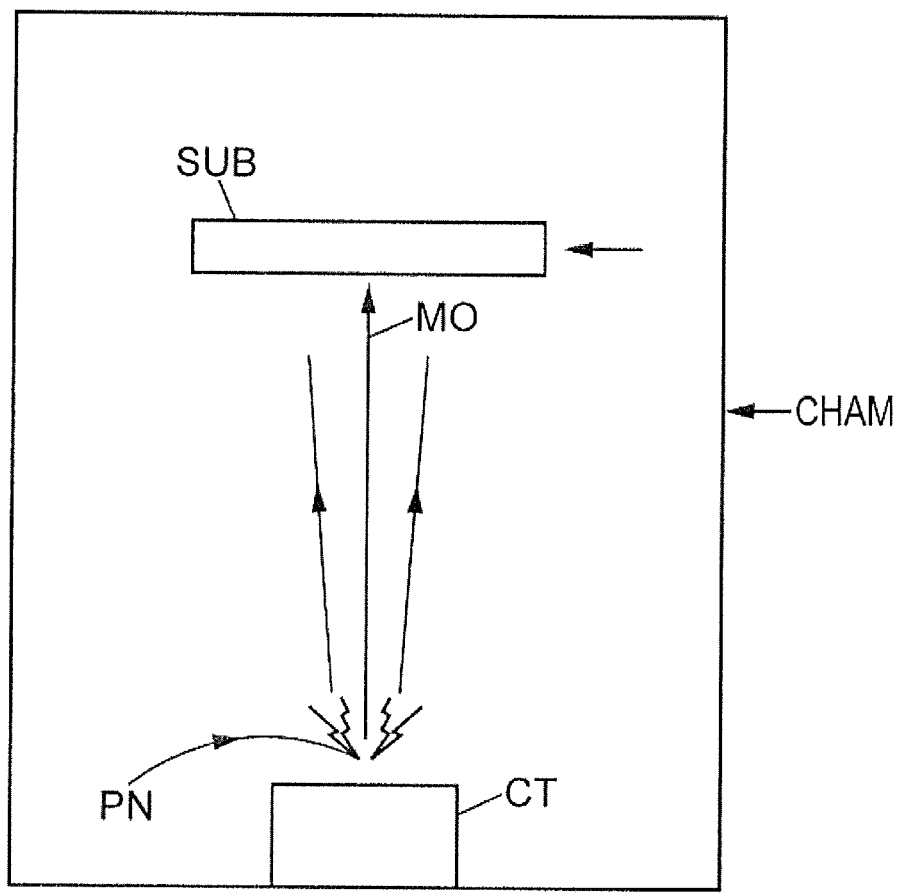
Figure 7:
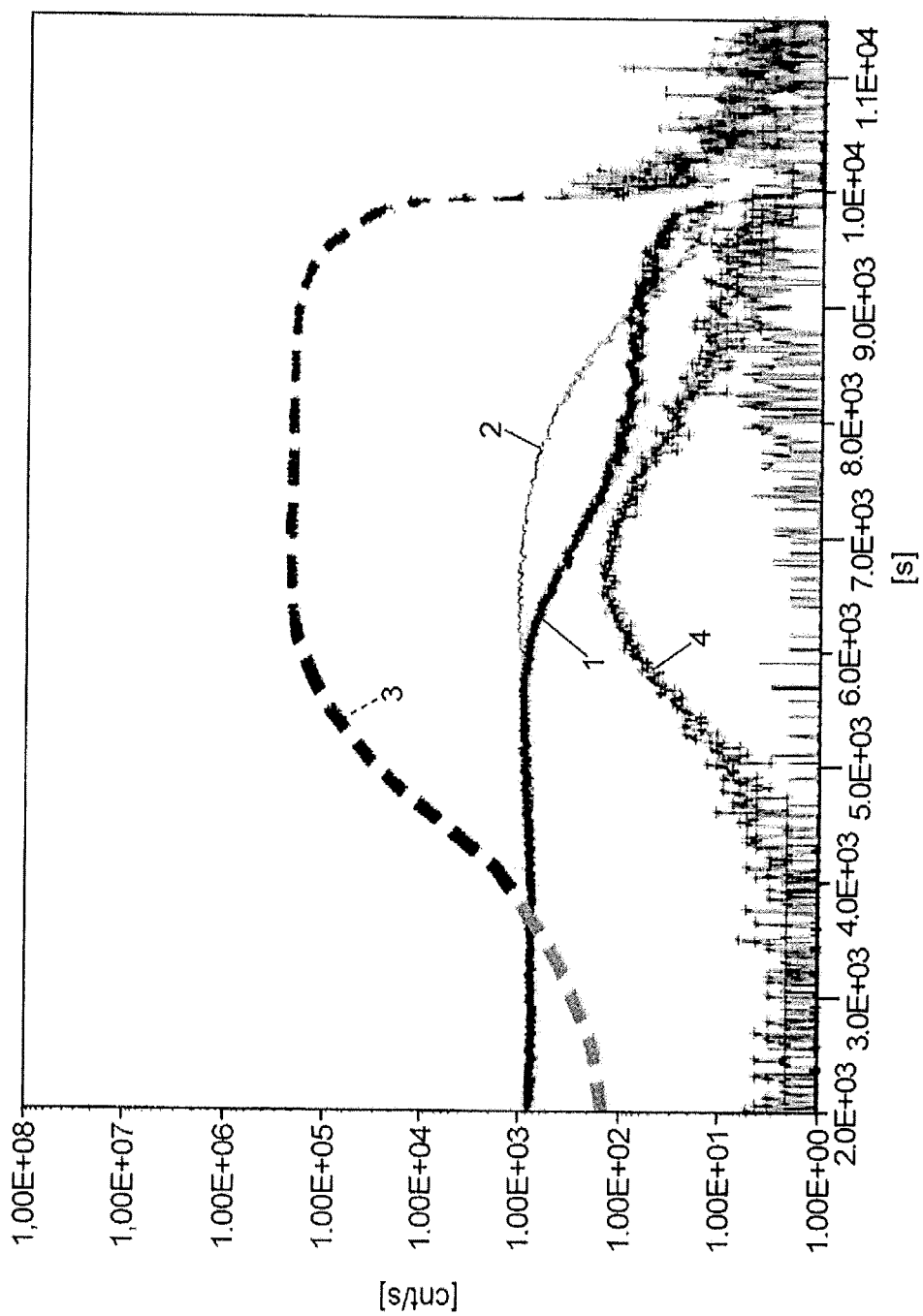

Other features and advantages of the invention will be apparent from reading the following detailed description of some non-limiting example embodiments presented for illustrative purposes, and by examining the attached drawings in which:

FIG. 1 illustrates a stack of layers I and III, as precursor, according to an embodiment of the method presented above, FIG. 2 illustrates an example embodiment in which a first heat treatment is applied to the precursor to combine the elements I and III, FIG. 3 illustrates a second heat treatment in the presence of element VI, FIG. 4 illustrates the I-III-VI$_2$ alloy layer (reference C136) ultimately obtained after the second heat treatment, FIG. 5A illustrates details of a contact layer in an example embodiment of the invention, in a stack corresponding to FIG. 1, FIG. 5B illustrates details of the contact layer of the invention, after the second heat treatment corresponding to FIG. 3, FIG. 6 schematically illustrates an installation for implementing the invention, FIG. 7 illustrates comparative curves of SIMS (Secondary Ion Mass Spectroscopy) measurements conducted on selenium (with barrier layer: curve 1, without barrier: curve 2), with curve 3 illustrating the measurements on molybdenum and curve 4 the measurements on nitrogen, in the example embodiment where the element added to the molybdenum during deposition of the barrier layer is nitrogen.

In an example embodiment, a layer of molybdenum Mo is deposited, for example by sputtering (or PVD), as a rear contact layer of a photovoltaic cell. Its thickness is on the order of a micron, for example between 0.3 and 0.8 µm. The characteristic features of the invention in implementing this first deposition will be described below with reference to FIGS. 5A, 5B, 6 and 7.

Next, a stack of several layers of elements I and III is created by deposition (C1 for the layer of element I for example and C3 for a layer of element III). It can be arranged so that layers C1 of element I alternate with layers C3 of element III (as represented in FIG. 1).

In a particular embodiment described below, the following stack is deposited by electrolysis:
  a copper layer from 150 to 200 nm thick,
  an indium layer from 300 to 500 nm,
  a gallium layer from 100 to 200 nm.

The stack is then annealed (T° arrows in FIG. 2) with annealing conditions of a temperature of about 80° C. to 120° C. and a duration of several tens of minutes (for example about 30 minutes), to obtain in the end a layer C13 of I-III precursor.

Next, as illustrated in FIG. 3, heat treatment is applied while adding element VI, such as sulfur and/or selenium ("EL6" arrows in FIG. 3). The conditions for the addition of element VI may correspond to annealing with a progressive increase in temperature from 500 to 700° C. over several minutes, with injection of selenium vapor for example. Thus the selenium EL6 is able to react with the copper, indium, and/or gallium of the layer C13, while the temperature is maintained at 500 to 700° C. A layer C136 of alloy I-III-VI$_2$ that is homogeneous and of good quality is obtained, as shown in FIG. 4. However, the element VI also reacts with the metal of the contact layer, and a superficial layer SUP of a compound of metal-element VI (for example MoSe$_2$) is created naturally.

In the invention, the desire is to control the properties of this layer SUP (particularly the thickness and morphology). An example of an embodiment which achieves this will now be described, with reference to FIG. 6. The substrate SUB can be deposited on a movable sample holder in a thin film deposition chamber. This chamber CHAMB ensures conditions of very low pressure ("near-vacuum", for example less than 10$^{-5}$ bar) to avoid contamination by undesired substances in the layers currently being deposited.

The chamber comprises a source of the metal to be deposited (for example molybdenum), which may be in the form of a sputter target exposed to the action of a plasma of argon or another neutral gas. The metal atoms sputtered in this way are deposited on the substrate SUB. As indicated above, the device holding the substrate can be moved in a manner that ensures homogeneity in the deposition of the molybdenum layer. For example, there can be N passes of the substrate SUB in front of the source (with N=4, for example). In an embodiment according to the invention, during at least one of these passes (the jth pass), a proportion of about 20% of nitrogen P$_N$ is introduced into the plasma.

A stack of thin films resulting from such an embodiment, before the addition of the element VI, is represented in a cross-sectional view in FIG. 5A. In particular, the thin film of molybdenum Mo has a structure comprising:

- molybdenum Mo (relatively "pure" or at least "conductive") on the substrate SUB,
- a mixture MO-EA of molybdenum and an additional element, such as nitrogen in the example embodiment described here, this mixture advantageously forming a barrier to the migration of element VI (for example selenium and/or sulfur) during the heat treatment of FIG. 3,
- and again molybdenum Mo ("sacrificial"), denoted SAC, at the interface with the future layers I-III, before heat treatment.

In this example embodiment, we have N=4 and j=3 for example, using the notations used above with reference to FIG. 6.

Now with reference to FIG. 5B, a superficial layer SUP forms above the barrier MO-EA after the heat treatment, as a product of the reaction of the molybdenum of the "sacrificial" layer SAC and the selenium for example issuing from the addition of element VI (during a "selenization" step), having the usually observed composition MoSe$_2$.

This is a superficial layer SUP, its properties (particularly the thickness and morphology) being closely controlled by the presence of the barrier MO-EA preventing diffusion of the element VI.

The following table provides detailed characteristics of a molybdenum layer deposition in accordance with the embodiment shown in FIG. 6, as it appears before the addition of element VI (FIG. 5A).

| Step | Description | Mode; Power; Precision | N$_2$ flow as % of total flow Ar:N$_2$ | Thickness |
|---|---|---|---|---|
| Mo close to substrate | Deposition by PVD (Physical Vapor Deposition) of "conductive" molybdenum | DC; 5330 W; 5 μbar | 0% | 450 nm |
| MO-EA barrier | Deposition of partially nitrided molybdenum | DC; 5330 W; 5 μbar | 20% N$_2$ | 100 nm |
| Sacrificial layer | Deposition by PVD of molybdenum intended to react with selenium for example to form MoSe$_2$ | DC; 5330 W; 5 μbar | 0% | 60 nm |

Typically, before the selenization heat treatment (FIG. 5A), the molybdenum layer in contact with the substrate can be of a thickness on the order of 450 nm. Then the barrier layer MO-EA can be of a thickness of below 100 nm, and the sacrificial layer SAC can have a thickness of about 60 nm.

After the selenization heat treatment (FIG. 5B), a superficial layer SUP is formed. The variation in thickness in the plane x,y of the layer (z being the axis of the layer thickness) is less than or approximately equal to 10%, according to measurements conducted using transmission electron microscopy (TEM).

Such a variation is very slight relative to that usually observed in the prior art for a layer of MoSe$_2$ (with no barrier layer). In particular, such a layer of MoSe$_2$ in the prior art exhibits a very inhomogeneous morphology. Its thickness in the plane x,y varies in a non-orderly and non-uniform manner. In contrast, the layer of MoSe$_2$ obtained by the method of the invention is thinner and presents a much more homogeneous morphology.

In such an embodiment illustrated in FIGS. 5A and 5B, the presence of a sacrificial layer SAC of a given thickness is allowed for. However, in a variant of the embodiment illustrated in FIGS. 5A and 5B, it is possible to "terminate" the molybdenum layer with, the barrier layer MO-EA (therefore j=N, using the above notations). Under these conditions, it has been observed by TEM microscopy that a superficial layer of MoSe$_2$ is still obtained, but it is very thin (less than 10 nm thick).

Thus the invention allows controlling the thickness of the superficial layer SUP, or even reducing it to a thickness on the order of a few nanometers.

The thickness of the superficial layer can therefore be optimized according to the implementation choices. It can be reduced to an order of less than 10 nm if the barrier layer is at the interface with the I-III precursors. Such a thickness can already be sufficient to give the desired properties to this layer of Mo-VI (good contact quality, effectiveness of laser etching, and/or others).

More generally, the thickness of the superficial layer can thus be controlled more precisely than in the prior art. As indicated above, the thickness measurements obtained by TEM microscopy for this layer have shown an improved homogeneity of the thickness in the plane of the layer compared to the prior art, with a mean variation of less than 10%, which also shows an improvement in the morphology of the superficial layer obtained by using the method of the invention.

The thickness of the layer Mo in contact with the substrate is usually on the order of 450 nm in order to guarantee good conductivity and help achieve good homogeneity in the electrodeposition of the I and III precursors. However, it could be reduced due to the improvement in electrodeposition performance obtained with a superficial layer SUP according to the invention, which would then reduce manufacturing costs (particularly the costs of the molybdenum deposition).

The MO-EA barrier layer may have a thickness of 50 nm. Even so, optimizing the molybdenum nitriding rate relative to the thickness of the barrier layer can allow reducing the thickness of the barrier layer, which further reduces manufacturing costs. For this purpose, the flow of the $N_2$ gas in the argon plasma (as a %) can be controlled while maintaining the same parameters for the process (pressure, power, etc.).

FIG. 7 shows comparative curves of SIMS (Secondary Ion Mass Spectroscopy) measurements conducted on selenium (with barrier layer: curve 1, without barrier layer: curve 2), with curve 3 illustrating the measurements on molybdenum (for comparative purposes and as dotted lines) and curve 4 the measurements on nitrogen. The SIMS curves are to be interpreted while keeping in mind that the start of the curves (on the left) corresponds to the upper surface of the layers, while the end of the curves (on the right) corresponds to the interface deep inside the layers. It is clear that the bulge observed in curve 2 for selenium (without barrier), although with a strong signal level for the molybdenum (curve 3), is related to a strong presence of selenium in the molybdenum layer when there is no barrier. On the contrary, in the presence of nitrogen for forming the barrier layer (curve 4), a clear decrease in the presence of selenium (curve 1) is observed.

Of course, the invention is not limited to the embodiment described above as an illustrative example; it extends to other variants.

The types of atoms forming a barrier with the molybdenum may be nitrogen, or oxygen, or titanium or chrome, for combining with the molybdenum during a step of growing and forming a barrier to the diffusion of the element VI.

The element VI may be selenium as described above, or sulfur.

The invention claimed is:

1. Method for fabricating a I-III-$VI_2$ layer having photovoltaic properties, comprising:
   deposition of molybdenum on a substrate to form a contact layer comprising a first sublayer and a second sublayer, said deposition comprising a first step during which the molybdenum is deposited to form said first sublayer and a second step during which the molybdenum and an additional element which is absent from the first sublayer are deposited to form said second sublayer and to form a compound, in the contact layer, acting as a barrier to the diffusion of an element VI,
   deposition of a precursor of the I-III-$VI_2$ layer on the contact layer, and
   heat treatment of the precursor with an addition of the element VI to form the I-III-$VI_2$ layer from said precursor,
   wherein, said heat treatment comprises forming a superficial layer between the second sublayer of the contact layer and the I-III-$VI_2$ layer, said superficial layer comprising a compound combining the molybdenum of said contact layer and the element VI added during said heat treatment.

2. Method according to claim 1, wherein said second step is followed by the first step.

3. Method according to claim 1, wherein said second step ends the deposition of the contact layer.

4. Method according to claim 1, wherein said second step is preceded by said first step.

5. Method according to claim 1, wherein the molybdenum is deposited by sputtering a target containing said molybdenum, the sputtering being assisted by a plasma containing said additional element during said second step.

6. Method according to claim 1, wherein the molybdenum is deposited by sputtering a target containing, during said second step, the molybdenum and the additional element.

7. Method according to claim 1, wherein the additional element is selected from among:
   nitrogen, to form a nitride as barrier material to the element VI,
   oxygen, to form an oxide as barrier material to the element VI, and
   a metal to form an alloy as barrier material to the element VI.

8. Method according to claim 1, wherein the element VI is selenium.

9. Method according to claim 1, wherein the deposition of the contact layer further comprises forming a sacrificial layer on top of the second sublayer, said sacrificial layer comprising molybdenum and reacting with said element VI during the heat treatment to form the superficial layer.

* * * * *